United States Patent [19]

Giannella

[11] Patent Number: 4,949,150
[45] Date of Patent: Aug. 14, 1990

[54] PROGRAMMABLE BONDING PAD WITH SANDWICHED SILICON OXIDE AND SILICON NITRIDE LAYERS

[75] Inventor: Piccolo G. Giannella, Saratoga, Calif.
[73] Assignee: Exar Corporation, San Jose, Calif.
[21] Appl. No.: 155,193
[22] Filed: Feb. 12, 1988

Related U.S. Application Data

[63] Continuation-in-part of Ser. No. 853,303, Apr. 7, 1986.
[51] Int. Cl.$^5$ .................. H01L 27/02; H01L 29/34; H01L 29/78
[52] U.S. Cl. ........................ 357/46; 357/44; 357/51; 357/23.13; 357/54
[58] Field of Search .................. 357/44, 46, 51, 23.13, 357/54

[56] References Cited

U.S. PATENT DOCUMENTS

| | | | |
|---|---|---|---|
| 3,448,354 | 6/1969 | Cohen | 357/36 |
| 4,211,941 | 7/1980 | Schade, Jr. | 357/51 |
| 4,228,450 | 10/1980 | Anantha et al. | 357/51 |
| 4,455,568 | 6/1984 | Shiota | 357/54 |
| 4,463,369 | 7/1984 | Harford | 357/46 |
| 4,633,291 | 12/1986 | Koyama | 357/51 |
| 4,636,832 | 1/1987 | Abe et al. | 357/68 |
| 4,723,197 | 2/1988 | Takiar et al. | 357/54 |
| 4,757,363 | 7/1988 | Bohm et al. | 357/23.13 |
| 4,803,541 | 2/1989 | Kouda | 357/23.13 |

OTHER PUBLICATIONS

Davis, "Bipolar Design Considerations for the Automotive Environment", Journal of Solid State Circuits, vol. SC8, No. 6, Dec. 1973, pp. 419-426.

*Primary Examiner*—Eugene R. LaRoche
*Assistant Examiner*—Michael B. Shingleton
*Attorney, Agent, or Firm*—Townsend and Townsend

[57] ABSTRACT

The present invention is a bonding pad structure and method for making the same which can be connected at the metalization step to form passive or active devices in addition to forming a bonding pad. A P-doped region is formed in an epitaxial layer in the area of the bonding pad at the perimeter of a chip. This P-doped region allows the formation of a junction capacitance between it and the epitaxial layer. In addition, by adding an oxide layer over the P-doped region an oxide capacitor can be formed between the metal bonding pad and the P-doped region with the oxide as the dielectric. The oxide layer is a special sandwich of two layers, silicon dioxide and silicon nitride. The sandwiched layers protects the components beneath the bonding pad. The P-doped region can also be used as a resistance by providing metal connections to both ends. Finally, a vertical PNP transistor can be formed between the P-doped region, the epitaxial layer and a P-doped substrate.

2 Claims, 4 Drawing Sheets

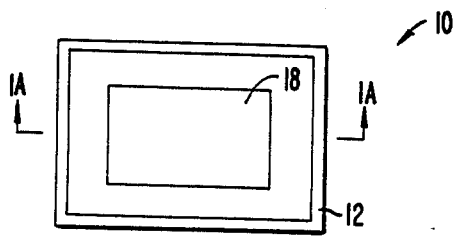
FIG._1.
PRIOR ART
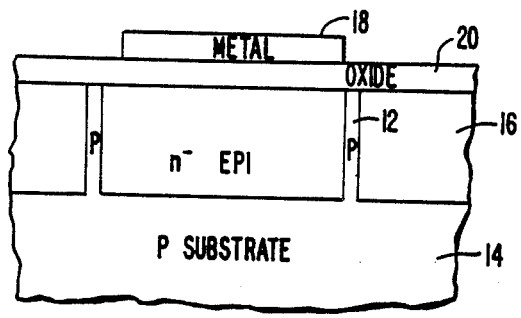
FIG._1A.
PRIOR ART
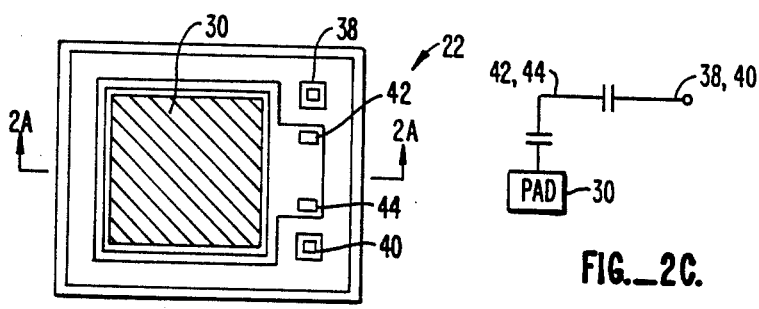
FIG._2.
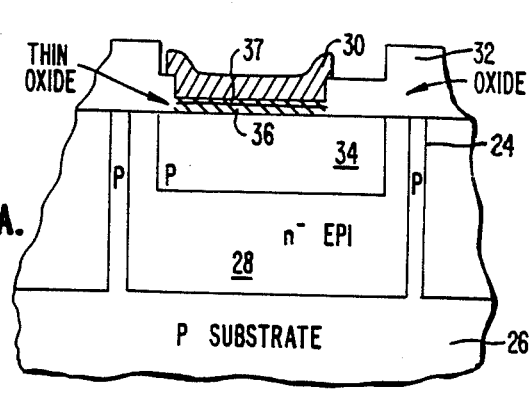
FIG._2A.
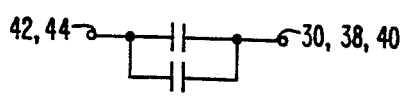
FIG._2B.
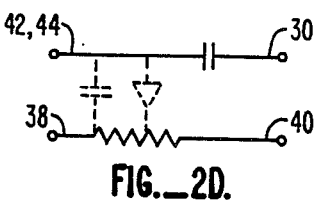
FIG._2C.
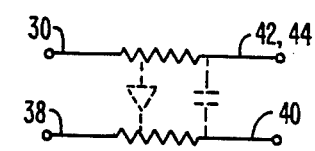
FIG._2D.
FIG._2E.

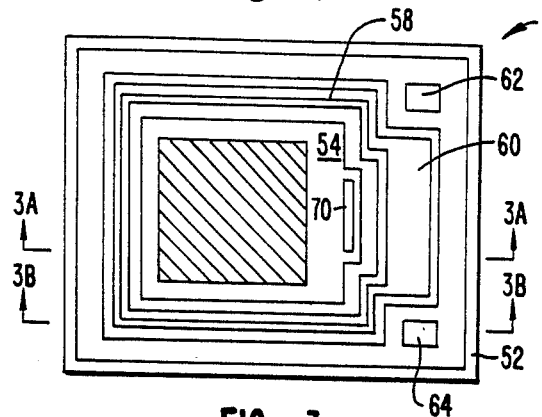
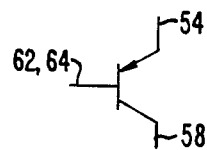
FIG._3.   FIG._3C.
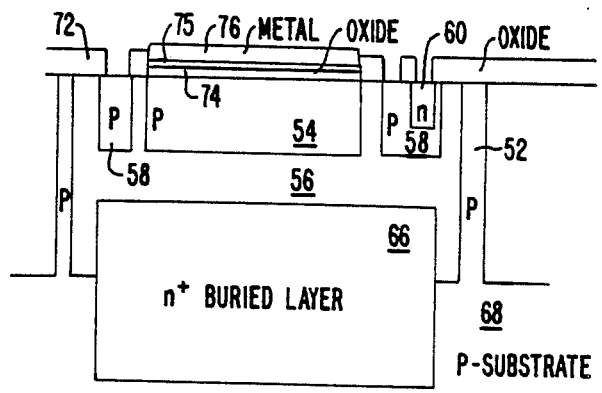
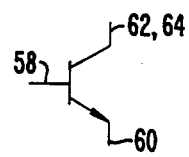
FIG._3A.   FIG._3D.
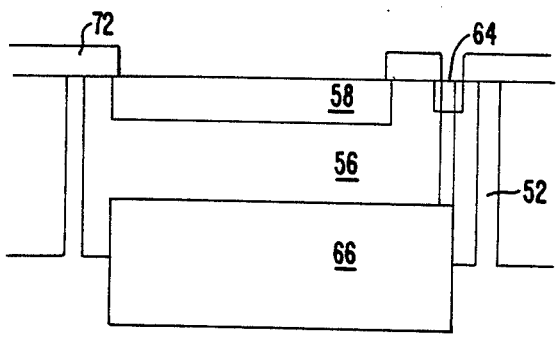
FIG._3B.

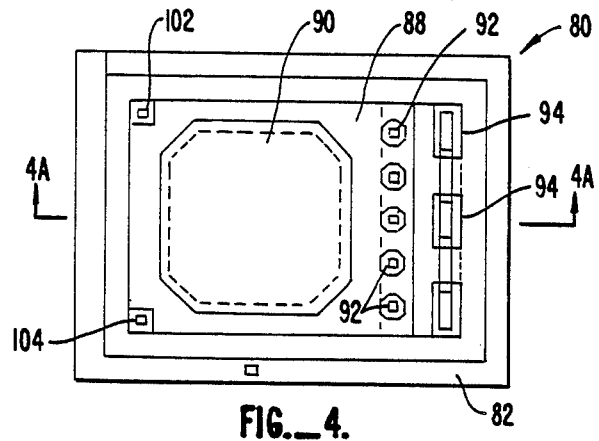
FIG._4.
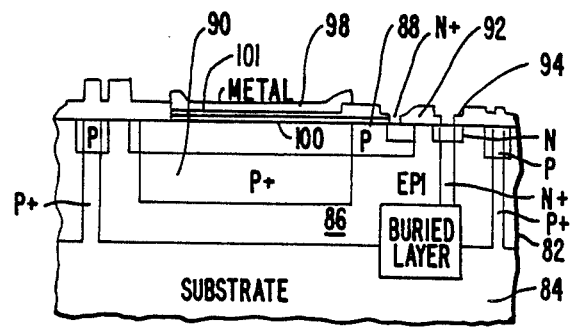
FIG._4A.
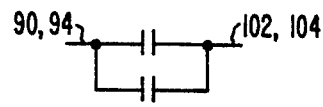
FIG._5A.
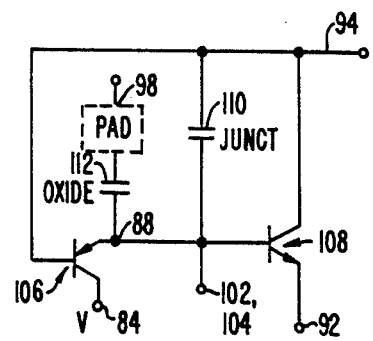
FIG._5F.

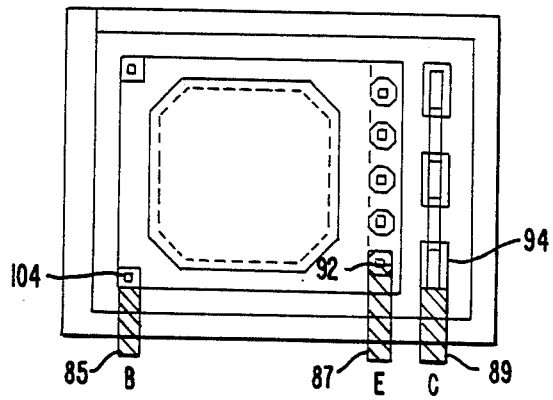
FIG._5C.
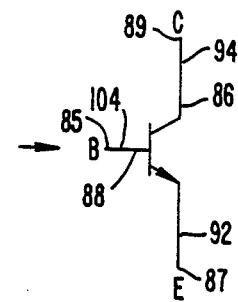
FIG._5B.
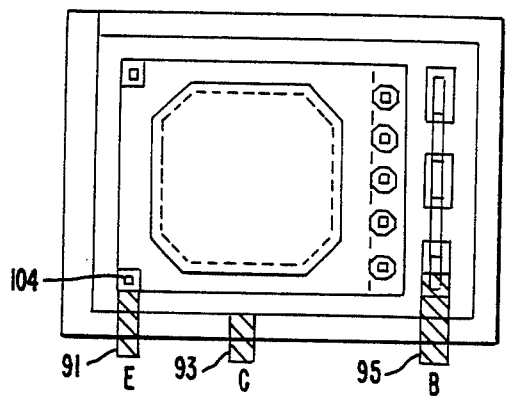
FIG._5E.
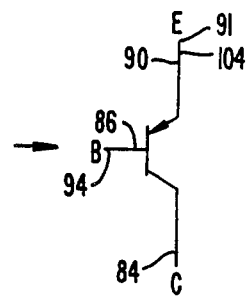
FIG._5D.

4,949,150

PROGRAMMABLE BONDING PAD WITH SANDWICHED SILICON OXIDE AND SILICON NITRIDE LAYERS

This is a continuation-in-part of application Ser. No. 853,303, filed Apr. 7, 1986.

BACKGROUND

The present invention relates to bonding pads for semiconductor chips.

Semiconductor chips have bonding pads which are relatively large areas of metalization providing a contact area for an assembler to solder a wire connection to one of the pins of an integrated circuit package. This wide metal area of the bonding pad is then coupled to the tiny metal connections of the integrated circuit. The semicustom method of designing and fabricating integrated circuits uses prefabricated semiconductor wafers which have completed circuits except for the final process step of device or component interconnection. A cost savings is realized by adapting a standard wafer, which has already been designed and manufactured, to a particular customer's needs by simply designing appropriate metal interconnections. Thus, for each customer, a metal mask is designed which connects the necessary active and passive semiconductor components to form the circuit configuration required by the customer. This method of design and fabrication allows development of a semicustom circuit in less time and at lower cost than if the entire wafer had to be independently designed for each customer.

One limitation in semicustom design is that the number of bonding pads required to form connections to a particular customer's circuit will vary from customer to customer. Accordingly, a standard chip design will have enough bonding pads to accommodate the largest number anticipated to be required by any customer. This results in a number of bonding pads being wasted space for a large number of customers. A bonding pad will typically be a cell area which is simply an N-doped epitaxial layer on top of a P-doped substrate. Inherent in this structure is a clamping diode or a capacitance. For the clamping diode, the N portion of the diode is the epitaxial region and the P portion of the diode is the substrate. The junction capacitor is formed at the junction of the substrate and the epitaxial region. Thus, in some circuit designs, it may be possible to take advantage of this inherent capacitance or clamping diode.

SUMMARY OF THE INVENTION

The present invention is a bonding pad structure and method for making the same which can be connected at the metalization step to form passive or active devices in addition to forming a bonding pad. A P-dope region is formed in an epitaxial layer in the area of the bonding pad at the perimeter of a chip. This P-doped region allows the formation of a junction capacitance between it and the epitaxial layer. In addition, by adding an oxide layer over the P-doped region an oxide capacitor can be formed between the metal bonding pad and the P-doped region with the oxide as the dielectric. The oxide layer is a special sandwich of two layers, silicon dioxide and silicon nitride. The sandwiched layers protect the components beneath the bonding pad. The P-doped region can also be used as a resistance by providing metal connections to both ends. Finally, a vertical PNP transistor can be formed between the P-doped region, the epitaxial layer and a P-doped substrate.

In the preferred embodiment, an N-doped region is provided within the P-doped region and a separate N-doped region is provided outside of the P-doped region so that a NPN transistor can be formed. The outside N-doped region is preferably an N+ region coupling to a buried N+ layer. When not used as an NPN transistor, this buried N+ layer can provide a cross-under to allow routing around metal connections on the surface.

The invention allows the formation in the bonding pad cell of either a bonding pad, an NPN transistor with a single or multiple emitters, a vertical PNP transistor, an oxide or junction capacitor or both, two matched, low value resistors and a cross-under connection. In many applications some of these components can be used at the same time; for example, the bonding pad can be connected to the collector of the NPN transistor and a junction capacitor can be formed between the collector and base of the transistor. Another possible application is the formation of a PNP vertical transistor with a bonding pad connected to its base or its emitter.

In one preferred embodiment, a square shaped P-doped region is formed in the epitaxial layer. A central portion of this P-doped region is doped more heavily to be P+. A series of five N-doped regions are formed along one edge of the lightly P-doped area. Parallel to this, in the adjacent epitaxial region are formed three N+ diffused regions which couple to an N+ buried layer which extends beneath the five N-doped regions.

For a fuller understanding of the nature and advantages of the invention, reference should be made to the ensuing detailed description taken in conjunction with the accompanying drawings.

BRIEF DESCRIPTION OF THE DRAWINGS

FIGS. 1 and 1A are diagrams of a prior art bonding pad cell;

FIGS. 2 and 2A are diagrams of the top and cross-section views, respectively, of a simple programmable bonding pad cell according to the present invention;

FIGS. 2B-2E are schematic diagrams of various circuits formed from the cell of FIG. 2;

FIGS. 3, 3A and 3B are diagrams of the top and two cross-sectional views of a programmable bonding pad cell according to an alternate embodiment of the present invention, where a lateral PNP transistor is also generated;

FIGS. 3C and 3D are schematic diagrams of a PNP and NPN transistor, respectively, formed from the cell of FIG. 3;

FIGS. 4 and 4A are surface and cross-section views of a second alternate embodiment of the programmable bonding pad cell according to the present invention; and FIGS. 5A-5F are schematic diagrams of the embodiment of FIG. 4 coupled as a parallel junction and oxide capacitor, an NPN transistor, a PNP transistor, and a circuit having a bonding pad, junction and oxide capacitors and PNP and NPN transistors, respectively.

DETAILED DESCRIPTION OF THE PREFERRED EMBODIMENTS

FIG. 1 shows a prior art bonding pad cell 10, which is shown in cross-section in FIG. 1A. Cell 10 is bordered with a P-doped isolation boundary 12 connecting the surface of the cell to a P-doped substrate 14 through epitaxial region 16. A metal layer 18 forms the bonding pad on top of an oxide layer 20. This structure has an inherent clamping diode between N-doped epitaxial region 16 and P-doped substrate 14, as well as a junction capacitance between these regions.

FIGS. 2 and 2A show a first embodiment of the present invention. A bonding pad cell 22 is bordered by a P-doped isolation region 24 which connects the surface to a P-doped substrate 26 through N-doped epitaxial region 28. A metal bonding pad 30 is placed in an opening in oxide layer 32. Beneath metal layer 30 is a P-doped region 34. A thin sandwich layer of a silicon dioxide layer 36 and a silicon nitride (SiN4) layer 37 separates bonding pad 30 from P-doped region 34. In addition, a pair of N+ regions 38, 40 provide connections to epitaxial layer 28.

The structure of FIG. 2 can be used to form a junction capacitor between P-doped region 34 and N-doped epitaxial region 28. This can be done by providing a metal connection directly to P-doped region 34 by omitting at least a portion of thin oxide layers 36, 37 or through openings 42, 44 in oxide layer 32. A connection to the epitaxial region 28 is provided by one or both of N+ regions 38 and 40. Alternatively, an oxide capacitor is formed between P-doped region 34 and metal 30. A connection to P-doped region 34 is provided through openings in oxide layer 32 at positions 42 and 44.

Cell 22 can be used as a resistor by providing metal connections to positions 42 and 44 and using P-doped region 34 as a resistance. Alternatively, metal connections can be provided to N+ regions 38 and 40 to provide a low resistance cross-under through epitaxial region 28.

The purpose of the present invention is to use the silicon area under the bonding pad as active and passive components, and not just as a mechanical support of the bonding pad. In this way the silicon utilization is improved greatly and more components can be placed in a die of a given area.

For this purpose, the oxide under the bonding pad is never allowed to break, otherwise the components below the bonding pad will be destroyed or seriously affected in performance. To achieve this protection, a special sandwich of two layers of silicon dioxide and silicon nitride are used as protection. Silicon nitride is more mechanically resistant to pressure than silicon dioxide. The oxide under the bonding pad is used for two functions: protection of the underlying regions destined to be used as active and passive components and as dielectric material for the capacitor.

The silicon nitride has a higher dielectric constant then the conventional silicon dioxide used previously, thus giving higher capacitance with the same thickness. (A capacitance of high value is one of the functions accomplished by the present invention.) Therefore, for a fixed capacitance value, the nitride will allow a thicker film to be used, thus providing higher mechanical strength. The silicon dioxide is used as the first layer to provide good adhesion and to avoid interface problems between the silicon and the silicon nitride.

Preferably, each of the silicon dioxide an silicon nitride layers are approximately 1,000 angstroms thick.

Some of the circuits that can be formed from the cell of FIG. 2 are shown in FIGS. 2B–2E. FIG. 2B shows a junction and an oxide capacitance in parallel. FIG. 2C shows a bonding pad coupled by a oxide capacitance to a first contact which is coupled by a junction capacitance to a second contact. FIG. 2D shows the formation of a low resistance cross-under between N+ regions 38 and 40. A parasitic capacitance and diode are shown in phantom. FIG. 2E shows the formation of two resistances, with the first resistance being the low resistance cross-under of FIG. 2D and the second resistance being formed between contacts 42 and 44 and bonding pad 30, with oxide layer 36 being omitted. In this configuration, pad 30 preferably only contacts P-doped region 34 at the end opposite contacts 42, 44. Again, parasitic capacitance and a parasitic diode are shown in phantom.

FIGS. 3–3B show a second embodiment of the present invention. A bonding pad cell 50 is surrounded by a P-doped isolation region 52 and has a central P-doped region 54 in epitaxial layer 56. A second P-doped region 58 surrounds P-doped region 54. An N-doped region 60 is located within P-doped region 58 along a first side of the cell. Additional N-doped regions 62, 64 are coupled to a buried N+ layer 66.

A PNP transistor can be formed from the structure of FIG. 3 by making the connections shown in FIG. 3C, and an NPN transistor can be formed by making the connections shown in FIG. 3D.

In addition, an oxide or junction capacitance can be formed in the same manner as shown for FIG. 2 with a contact region 70 providing a connection to P-doped region 54 through oxide layer 72. A thin silicon dioxide layer 74 and silicon nitride layer 75 can be deposited on top of P-doped region 54 and metal layer 76 can be applied on top of thin layers 74, 75 to form an oxide capacitance between metal 76 and P-doped region 54. Alternately, or in addition, metal layer 76 can be used as a bonding pad with layers 74, 75 either present or eliminated.

FIG. 4 shows a top view of a bonding pad cell 80 according to another embodiment of the present invention. FIG. 4A is a cross-sectional view along lines 4A—4A of FIG. 4. The cell is bordered by a P-doped isolation region 82 which couples to the P-doped substrate 84 forming an epitaxial island 86. A lightly P-doped region 88 is provided and has an internal more highly doped P+ region 90. A series of five N-doped regions 92 are located along the perimeter of one edge of P-doped region 88. Three N+ doped regions 94 provide connections to a buried N+ layer 96. A metal layer 98 is formed over a thin silicon dioxide layer 100 and silicon nitride layer 101 on top of P-doped region 88.

FIGS. 5A–5F show various circuits which can be formed with the cell structure of FIG. 4. In FIG. 5A a junction and an oxide capacitance connected in parallel are shown. The oxide capacitor is formed by the common method where one plate is the aluminum metalization and the other plate is a diffused area. However, instead of using the N+ region of an emitter diffusion as in the common fabrication method, a P diffusion is used instead. This automatically creates another capacitor, a junction capacitor, between P region 88 and N-doped epitaxial region 86. The two capacitors can be connected in parallel by connecting the metal plate 98 to N+ region 92. If the oxide thickness of thin oxide layer 100, 101 is 1800 angstroms, the capacitance is 0.12 pF (picofarads) per square mils. For an epitaxial resistivity of 2 ohm-cm, the junction capacitor has a value of about 0.2 pF per square mils. The use of a deep heavily doped P+ diffusion as the top iso, 90, increases the junction capacitance approximately 30% because the junction area increases approximately the same amount. This also reduces the parasitic series resistance by about 50 times because the top iso has a higher concentration of the base.

P+ region 90 can be used to form two matched low value resistors through P region 90 between metal contact 98 (with oxide layer 100, 101 omitted) and a pair of contact areas 102, 104.

An NPN transistor can be formed as shown in FIG. 5B with either or both of contacts 102, 104 providing the base contact, areas 92 forming the emitter and areas 94 forming the collector. Lightly doped P region 88 is the region coupled to by contact areas 102 and 104, providing the base of the transistor.

FIG. 5C shows one example of the metal connections that can be made on the cell of FIG. 4 to form the circuit of FIG. 5B. Metal 85 connects to contact area 104 to provide the base connection, metal 87 connects to an area 92 to provide the emitter connection, and metal 89 connects to an area 94 to provide the collector connection.

FIG. 5D shows the connection of cell 80 of FIG. 4 as a PNP transistor. P+ area 90 forms the emitter of the transistor, N+ diffusions 94 to buried layer 96 couple to epitaxial layer 86 to form the base of the transistor, and substrate 84 is the collector of the transistor. The substrate is usually coupled to the most negative voltage, so this transistor has its collector coupled to the most negative voltage. The performance of this device is much better than the usual vertical PNP because of the higher emitter concentration and the thinner base obtained with the deep P+ diffusion 90.

FIG. 5E shows one example of the metal connections that can be made on the cell of FIG. 4 to form the transistor of FIG. 5D. Metal 91 connects to contact area 104 to provide the emitter connection, metal 93 connects to isolation region 82, which is connected to substrate 84, to form the collector connection and metal 95 is connected to an area 94 to provide the base connection.

Metal layer 98 can be used as a bonding pad in connection with the other functions at all times, unless the 0.6 pF capacitor between the pad and P-doped area 88 affects the circuit performance. The normal width of oxide layer 100, 101 would be about 6000 angstroms, but when a higher value oxide capacitor is required, the oxide thickness can go below 2000 angstroms.

FIG. 5F shows how NPN and PNP transistors along with junction and oxide capacitors and the bonding pad are connected together. The collector of a PNP transistor 106 is tied to substrate 84 which will normally be ground or the most negative voltage. The base 94 of PNP transistor 106 also forms the collector of a NPN transistor 108 and one side of a junction capacitor 110. Metal bonding pad 98 is one end of an oxide capacitor 112 with the other end being P-doped region 88, which also forms the other side of junction capacitor 110, as well as the base of NPN transistor 108 and the emitter of PNP transistor 106. The contact to P-doped region 88 is provided through areas 102 and 104. The emitter of NPN transistor 108 is contacted through regions 92.

The present invention provides several advantages over existing semicustom designs in addition to the programmability of the bonding pad area which prevents it from being a wasted area when not used as a bonding pad. For instance, most semicustom designs do not provide integrated capacitors which are provided in the present invention. By placing the bonding pad on the periphery of the semiconductor chip, the capacitors are also on the periphery of the semiconductor chip and thus do not interfere with the routing of internal connections on the chip. By connecting the transistors of several pad cells in parallel, a high current transistor can be obtained which is ideal for an input/output interface. When not otherwise used, N+ areas 94 can provide a cross-under connection through buried layer 96.

Standard processing methods can be used to produce the bonding pad cells according to the present invention. The substrate is first doped to be P. The N+ buried layer is then diffused and the N- epitaxial layer is grown. Each diffusion step is performed using the standard steps of growing an oxide, depositing a photoresist coating, masking the coating, bombarding the wafer with ultraviolet light, dissolving away the noncrosslinked part of the photoresist and then etching through the silicon dioxide to expose regions where diffusion will take place.

After the epitaxial layer is grown, the deep P+ diffusion to form the isolation borders for the cell is done. Thereafter, the P diffusions are done, the N diffusions are done and the oxide is etched to form the contact regions for the cell. Metalization is done according to the standard techniques of applying aluminum over the wafer, photomasking and etching away everywhere except where connections are desired.

As will be understood by those familiar with the art, the present invention may be embodied in other specific forms without departing from the spirit or essential characteristics thereof. For example, the geometry of the cell could be varied or more diffusion areas could be added to produce different combinations so long as the basic P diffusions below the bonding pad is retained. Accordingly, the disclosure of the preferred embodiments of the present invention is intended to be illustrative, but not limiting, of the scope of the invention, which is set forth in the following claims.

What is claimed is:

1. A semiconductor chip having a plurality of bonding pad cells arranged around the perimeter of said chip, each bonding pad cell comprising:
    a P-doped substrate;
    an N-doped epitaxial region on top of said substrate, said epitaxial region having a rectangular-shaped surface large enough to receive a metal layer to form a bonding pad;
    a lightly P-doped rectangular region extending from said surface into said epitaxial region;
    a heavily P-doped region within said lightly P-doped region;
    a plurality of N-doped regions within said lightly P-doped region along a first edge of said lightly P-doped region;
    an N+ buried layer extending into said P-doped substrate proximate said first edge of said lightly P-doped region;
    a plurality of N+ regions outside said lightly P-doped region proximate said first edge and extending into said N+ buried layer;
    a layer of silicon dioxide extending over at least a portion of said P-doped region;
    a layer of silicon nitride extending over at least a portion of said silicon dioxide layer;
    at least one of said bonding pad cells having a metal bonding pad deposited over a substantial portion of said silicon nitride layer; and
    said lightly P-doped region and at least one of said bonding pad cells having a metal contact other than a bonding pad coupled to one of said P-doped regions.

2. A semiconductor chip having a plurality of bonding pad cells arranged around the perimeter of said chip, each bonding pad cell comprising:
- a P-doped substrate;
- an N-doped epitaxial region on top of said substrate, said epitaxial region having a rectangular-shaped surface large enough to receive a metal layer to form a bonding pad;
- a lightly P-doped rectangular region extending from said surface into said epitaxial region;
- a heavily P-doped region within said lightly P-doped region;
- a plurality of N-doped regions within said lightly P-doped region along a first edge of said lightly P-doped region;
- an N+ buried layer extending into said P-doped substrate proximate said first edge of said lightly P-doped region;
- a plurality of N+ regions outside said lightly P-doped region proximate said first edge and extending into said N+ buried layer;
- at least one of said bonding pad cells having a metal bonding pad deposited over a substantial portion of said N-doped epitaxial region; and
- said lightly P-doped region and at least one of said bonding pad cells having a metal contact other than a bonding pad coupled to one of said P-doped regions.

* * * * *